(12) United States Patent
Igeta et al.

(10) Patent No.: US 8,853,100 B2
(45) Date of Patent: Oct. 7, 2014

(54) FILM FORMATION METHOD, FILM FORMATION APPARATUS AND STORAGE MEDIUM

(71) Applicant: Tokyo Electron Limited, Tokyo (JP)

(72) Inventors: Masanobu Igeta, Tokyo (JP); Jun Sato, Nirasaki (JP); Kazuo Yabe, Nirasaki (JP); Hitoshi Kato, Oshu (JP); Yusaku Izawa, Tsukuba (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/930,667

(22) Filed: Jun. 28, 2013

(65) Prior Publication Data

US 2014/0004713 A1    Jan. 2, 2014

(30) Foreign Application Priority Data

Jun. 29, 2012   (JP) .................................. 2012-147711

(51) Int. Cl.
| | |
|---|---|
| *H01L 21/31* | (2006.01) |
| *B05D 5/06* | (2006.01) |
| *C23C 20/00* | (2006.01) |
| *C23C 16/06* | (2006.01) |
| *C23C 16/00* | (2006.01) |

(52) U.S. Cl.
USPC ............ 438/778; 438/792; 427/70; 427/96.6; 427/255.34; 427/255.394; 118/715; 118/722; 118/730

(58) Field of Classification Search
USPC ............ 438/778, 792; 427/508, 582–584, 70, 427/96.6, 255.34, 255.394; 118/715, 722, 118/730
See application file for complete search history.

(56) References Cited

U.S. PATENT DOCUMENTS

| | | | |
|---|---|---|---|
| 8,119,544 B2 * | 2/2012 | Hasebe et al. ................ | 438/792 |
| 8,138,104 B2 * | 3/2012 | Balseanu et al. ............. | 438/791 |
| 8,178,448 B2 * | 5/2012 | Nodera et al. ................ | 438/792 |

FOREIGN PATENT DOCUMENTS

JP          7-300678 A     11/1995

* cited by examiner

*Primary Examiner* — Evan Pert
*Assistant Examiner* — Gustavo Ramallo
(74) *Attorney, Agent, or Firm* — Nath Goldberg & Meyer; Jerald L. Meyer; Stanley N. Protigal

(57) ABSTRACT

According to an embodiment of present disclosure, a film formation method is provided. The film formation method includes supplying a first process gas as a source gas for obtaining a reaction product to a substrate while rotating a turntable and revolving the substrate, and supplying a second process gas as a gas for nitriding the first process gas adsorbed to the substrate to the substrate in a position spaced apart along a circumferential direction of the turntable from a position where the first process gas is supplied to the substrate. Further, the film formation method includes providing a separation region along the circumferential direction of the turntable between a first process gas supply position and a second process gas supply position, and irradiating ultraviolet rays on a molecular layer of the reaction product formed on the substrate placed on the turntable to control stresses generated in a thin film.

9 Claims, 18 Drawing Sheets

TENSILE STRESS

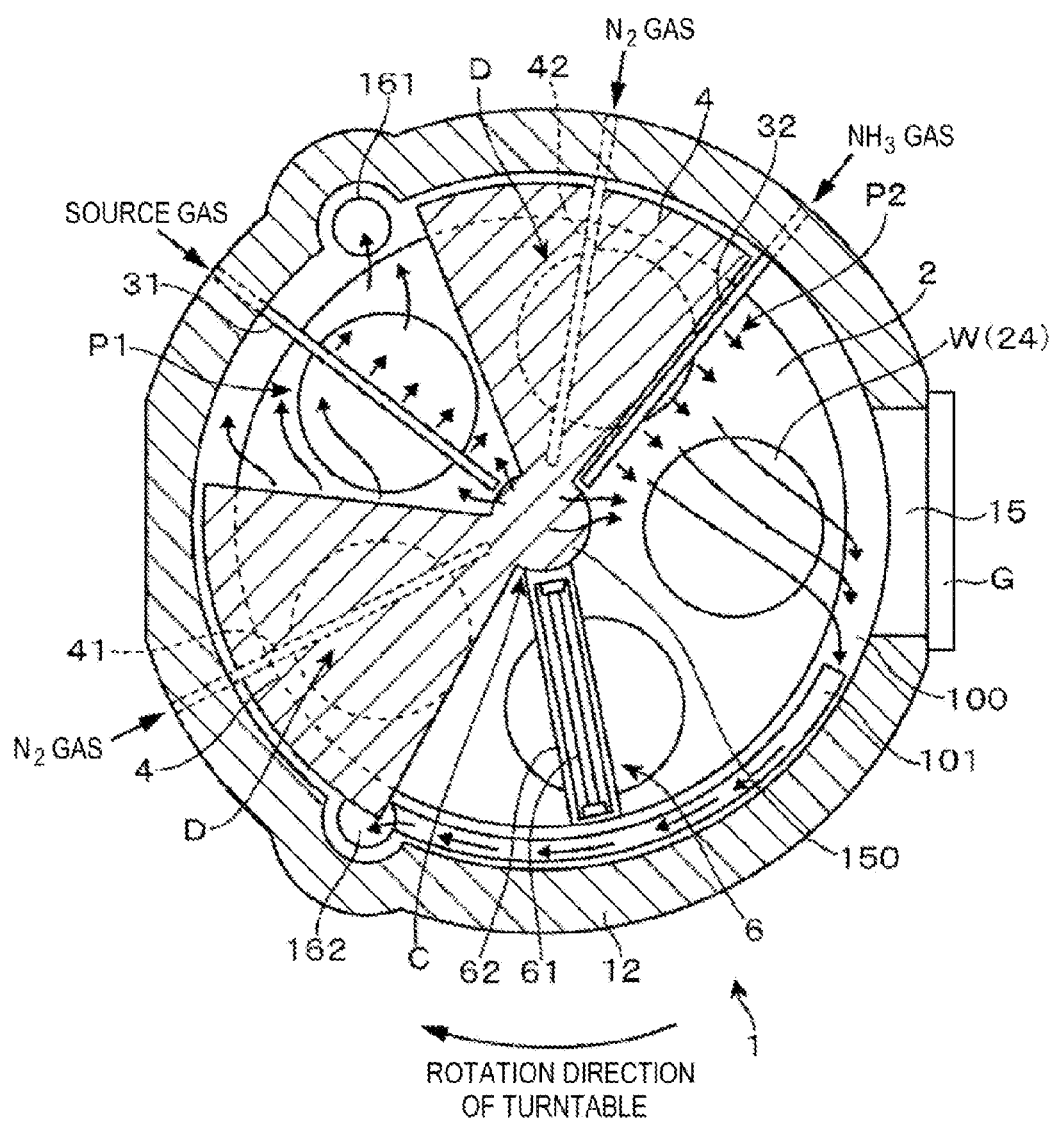

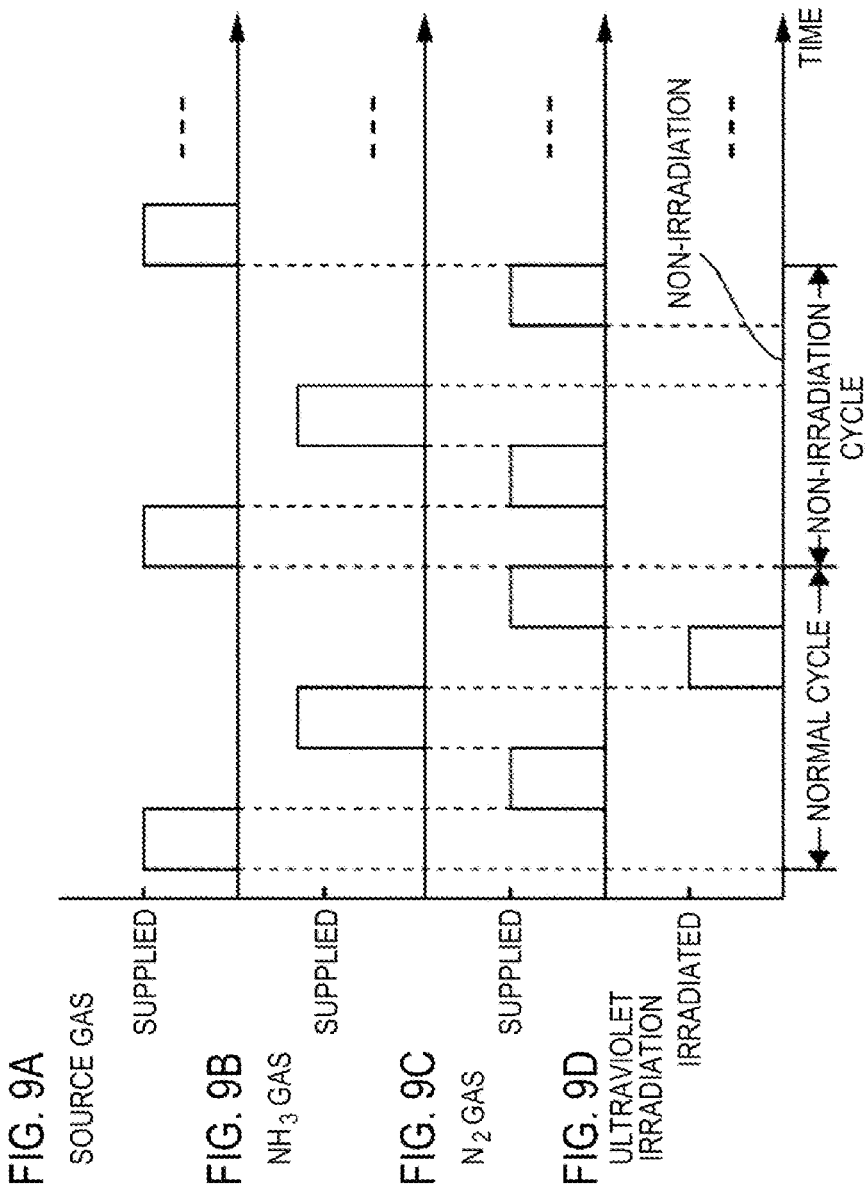

FILM FORMATION METHOD, FILM FORMATION APPARATUS AND STORAGE MEDIUM

CROSS-REFERENCE TO RELATED APPLICATION

This application claims the benefit of Japanese Patent Application No. 2012-147711, filed on Jun. 29, 2012, in the Japan Patent Office, the disclosure of which is incorporated herein in its entirety by reference.

TECHNICAL FIELD

The present disclosure relates to a technology for forming a thin film of aluminum nitride or silicon nitride on a substrate.

BACKGROUND

There is known a technology in which a stress liner film having a tensile stress or a compressive stress is formed on an upper surface of a FET (Field Effect Transistor) for use in a logic circuit and in which a strain is applied to the FET, thereby enhancing the mobility of carriers and increasing an operation speed. Plasma CVD (Chemical Vapor Deposition) or the like is used in forming the stress liner film. Silicon nitride or the like is used as the material of the stress liner film. The plasma CVD has an advantage in that the stress acting direction (the tension direction or the compression direction) and the magnitude of a stress can be controlled by changing plasma conditions.

In recent years, the development of a transistor having a three-dimensional structure, which is capable of additionally increasing the degree of integration and reducing the power consumption, is underway. Since the device of this kind has a protrusion portion with a large level difference, there is difficulty involved in forming a stress liner film through the use of a CVD method which provides coating performance with a low level difference.

Further, a film formation method, which provides coating performance with a higher level difference than the CVD method, such as an ALD (Atomic Layer Deposition) method and an MLD (Molecular Layer Deposition) method (both of which will be hereinafter referred to as an ALD method) is also used. The ALD method is a film formation method in which atomic layers or molecular layers are deposited by repeating a step of sequentially supplying different kinds of process gases including a raw material into a reaction vessel and causing reaction of these process gases while allowing the raw material to be adsorbed to the surface of a substrate. As a film material with which a stress liner film can be formed through the use of the ALD method, it is possible to cite the aforementioned silicon nitride. However, it is known that the ALD method has a difficulty in giving a large enough stress.

As one example of a double patterning technology for miniaturizing a wiring pattern, there is available a method of forming deposition portions called sidewalls on the opposite lateral walls of a linear mask pattern, removing the mask pattern, and patterning a lower layer film using the remaining sidewalls as new masks. A film formation process such as a CVD method or an ALD method is used in forming the sidewalls. Stresses generated during the film formation remain within the sidewalls. For that reason, if the aspect ratio of the sidewalls becomes higher along with the miniaturization of the wiring pattern, there is posed a problem in that pattern collapse may occur due to the increased influence of stresses acting on the sidewalls.

In this regard, there has been suggested a technology in which, when forming a deposition layer of metal oxide or metal oxynitride by an ALD method, ultraviolet rays are irradiated on a substrate supplied with a precursor gas, thereby dissociating impurities existing in a molecular layer formed on a substrate surface and terminating the surface of the molecular layer with OH groups having increased reaction activity. However, there is still a need of a method of controlling stresses generated in a deposition layer and a film material to which the method can be applied.

SUMMARY

Some embodiments of the present disclosure provide to a film formation method and a film formation apparatus, which are capable of controlling stresses generated in a thin film of aluminum nitride or silicon nitride, and a non-transitory storage medium storing the film formation method.

According to one embodiment of the present disclosure, there is provided a film formation method for obtaining a thin film by repeating, a plurality of times, a cycle in which different process gases are supplied one after another while revolving a substrate placed on a turntable within a vacuum chamber and depositing a molecular layer of a reaction product composed of aluminum nitride or a silicon nitride. The film formation method includes supplying a first process gas as a source gas for obtaining the reaction product to the substrate while rotating the turntable and revolving the substrate, and supplying a second process gas as a gas for nitriding the first process gas adsorbed to the substrate to the substrate in a position spaced apart along a circumferential direction of the turntable from a position where the first process gas is supplied to the substrate. Further, the film formation method providing a separation region along the circumferential direction of the turntable between a first process gas supply position from which the first process gas supplied and a second process gas supply position from which the second process gas supplied as to prevent mixing of the first process gas and the second process gas, and irradiating ultraviolet rays on the molecular layer of the reaction product formed on the substrate placed on the turntable to control stresses generated in the thin film.

According to another embodiment of the present disclosure, there is provided a film formation apparatus for obtaining a thin film by performing, a plurality of times, a cycle in which different process gases are supplied one after another while revolving a substrate placed on a turntable within a vacuum chamber and depositing a molecular layer of a reaction product composed of aluminum nitride or a silicon nitride. The film forming apparatus includes a first process gas supply unit configured to supply a first process gas, as a source gas for obtaining the reaction product, to the substrate, a second process gas supply unit installed in a position spaced apart from the first process gas supply unit along a circumferential direction of the turntable and configured to supply a second process gas, as a gas for nitriding the first process gas adsorbed to the substrate, to the substrate, a separation region installed between the first process gas supply unit and the second process gas supply unit along the circumferential direction of the turntable and configured to prevent the first process gas and the second process gas from being mixed with each other; and an ultraviolet irradiation unit configured to irradiate ultraviolet rays on the molecular layer of the reaction product formed on the substrate placed on the turntable to control stresses generated in the thin film.

According to yet another embodiment of the present disclosure, there is provided a non-transitory storage medium for storing a program used in a film formation apparatus for obtaining a thin film by performing, a plurality of times, a cycle in which different process gases are supplied one after another while revolving a substrate placed on a turntable within a vacuum chamber. The program incorporating steps for performing the film formation method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 8 is a view explaining the operation of the film formation apparatus.

FIGS. 9A to 9D are time charts of a film formation method including a cycle during which ultraviolet rays are not irradiated.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
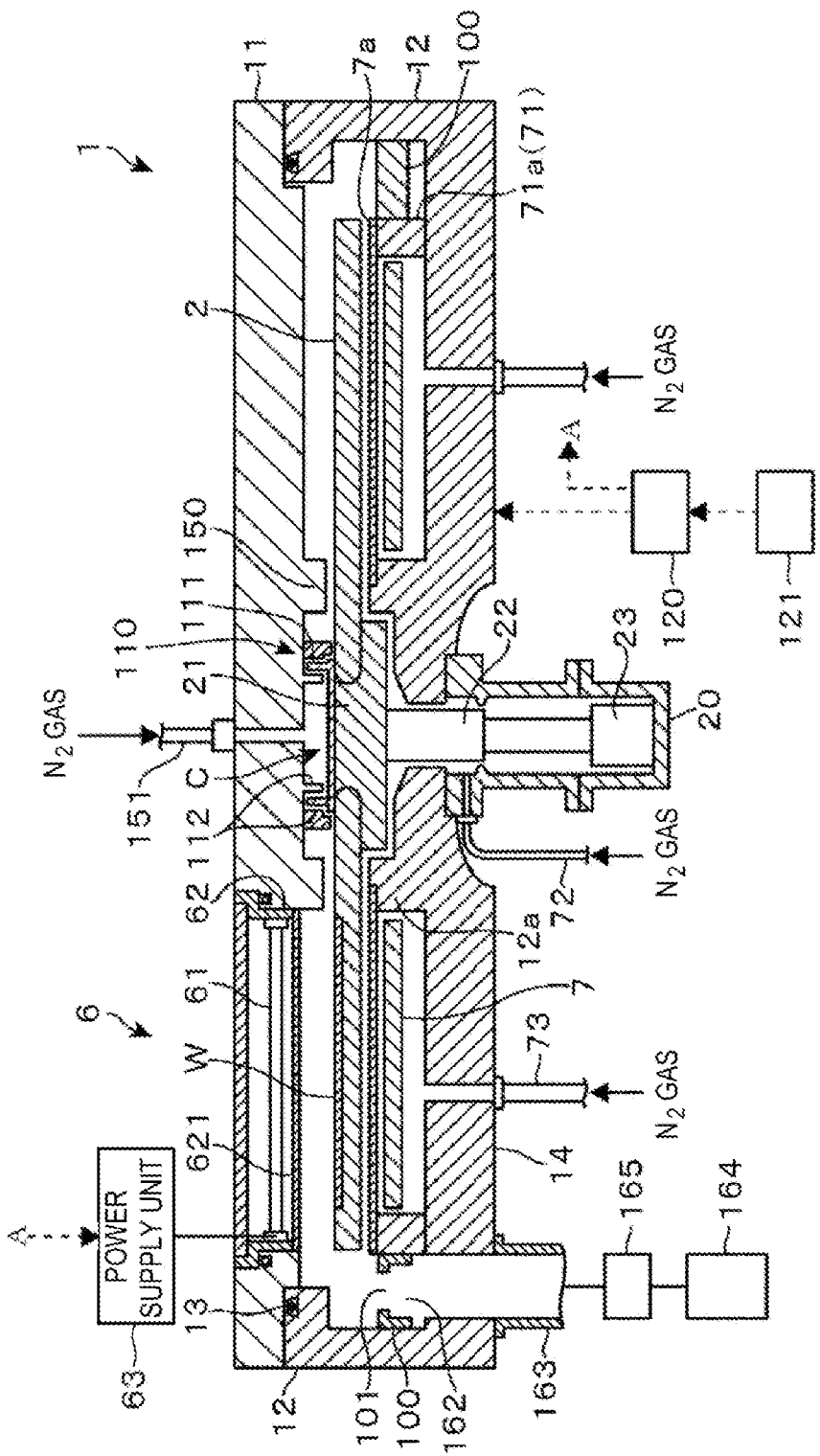
FIG. 1 is a vertical sectional side view showing one example of a film formation apparatus according to the present disclosure.
Figure 2:
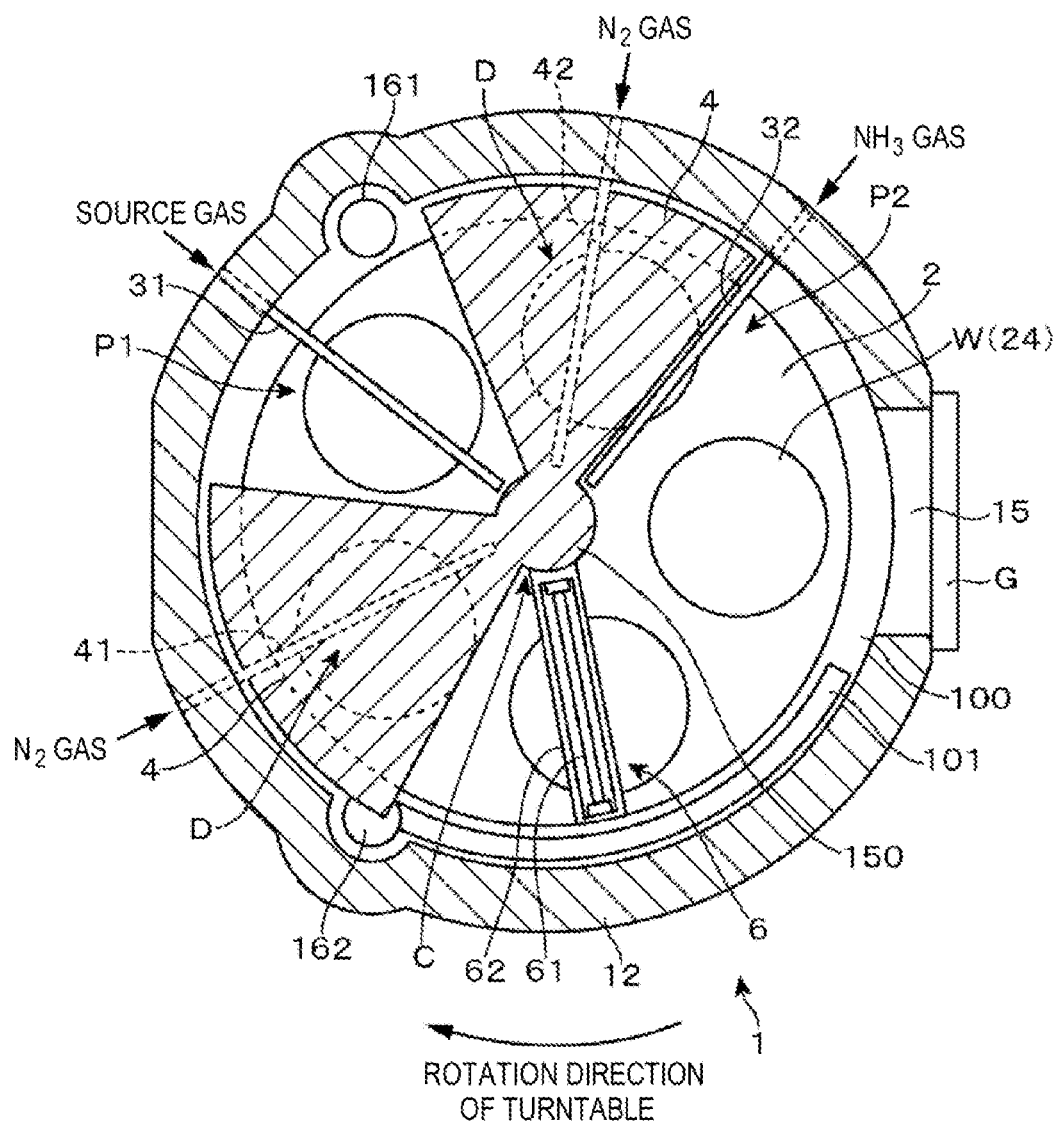
FIG. 2 is a horizontal sectional plan view of the film formation apparatus.

As one example of a film formation apparatus according to the present disclosure, the configuration of a film formation apparatus having a function of controlling stresses generated in a thin film when a thin film of aluminum nitride (hereinafter referred to as AlN film) is formed on the surface of a wafer W as a substrate by an Atomic Layer Deposition (ALD) method will be described with reference to FIGS. 1 to 3. As shown in FIGS. 1 and 2, the film formation apparatus includes a vacuum chamber 1 having a substantially circular plan-view shape and a turntable 2 installed in the vacuum chamber 1, the turntable 2 having a rotation center coinciding with the center of the vacuum chamber 1.

The vacuum chamber 1 includes a top plate 11 and a chamber body 12. The top plate 11 is removably attached to the chamber body 12. A separation gas supply pipe 151, which supplies an $N_2$ (nitrogen) gas as a separation gas for restraining different process gases from being mixed with one another in a central region C within the vacuum chamber 1, is connected to the central portion of the upper surface of the top plate 11. In FIG. 1, a sealing member 13, e.g., an O-ring, is annularly installed in the peripheral edge portion of the upper surface of the chamber body 12.

The turntable 2 is fixed to a core portion 21 having a substantially cylindrical shape at a central portion. The turntable 2 is configured to be rotatable around a vertical axis (clockwise in the present embodiment) by a rotating shaft 22 connected to the lower surface of the core portion 21 and extending in the vertical direction. In FIG. 1, a drive unit 23 is configured to rotate the rotating shaft 22 around the vertical axis, and a case body 20 is configured to house the rotating shaft 22 and the drive unit 23. The case body 20 has an upper flange portion hermetically attached to the lower surface of a bottom portion 14 of the vacuum chamber 1. Further, a purge gas supply pipe 72, which supplies the $N_2$ gas as a purge gas to a lower region of the turntable 2, is connected to the case body 20. The outer peripheral side of the core portion 21 in the bottom portion 14 of the vacuum chamber 1 is a protrusion portion 12a annularly formed so as to come close to the turntable 2 from the lower side.

As shown in FIG. 2, circular recess portions 24 for holding a plurality of, e.g., five, wafers W having a diameter of, e.g., 300 mm are formed on the front surface of the turntable 2 along the rotation direction (circumferential direction) of the turntable 2. The diameter and depth of the recess portions 24 is set such that, if the wafers W are dropped (received) into the recess portions 24, the surfaces of the wafers W are flush with the surface of the turntable 2 (the region of the turntable 2 on which the wafers W are not loaded). The recess portions 24 correspond to substrate holding regions in the present embodiment.

As shown in FIG. 2, four nozzles 31, 32, 41 and 42 respectively made of, e.g., quartz, are arranged in the positions of the turntable 2 facing the passage regions of the recess portions 24. The nozzles 31, 32, 41 and 42 are radially arranged in a mutually spaced-apart relationship along the circumferential direction of the vacuum chamber 1 (along the rotation direction of the turntable 2). The nozzles 31, 32, 41 and 42 are respectively attached so as to horizontally extend, e.g., from the outer peripheral wall of the vacuum chamber 1 toward the central region C in a facing relationship with the wafers W. In the present embodiment, a separation gas nozzle 41, a first process gas nozzle 31, a separation gas nozzle 42 and a second process gas nozzle 32 are arranged in the named order along the clockwise direction (the rotation direction of the turntable 2) when seen from a transfer gate 15 to be described later.

The nozzles 31, 32, 41 and 42 are respectively connected to individual gas sources (not shown) through flow rate control valves. More specifically, the first process gas nozzle 31 is connected to a gas source for supplying a first process gas as a source gas containing Al (aluminum), e.g., a triemthyl aluminum (TMA) gas, a triethyl aluminum (TEA) gas and the like. The second process gas nozzle 32 is connected to a gas source for supplying a gas for nitriding the first process gas, e.g., an $NH_3$ (ammonia) gas. The process gas nozzles 31 and 32 correspond to a first process gas supply unit and a second process gas supply unit, respectively. Further, the separation gas nozzles 41 and 42 are respectively connected to a gas source for supplying the $N_2$ (nitrogen) gas as the separation gas.

On the lower surface of each of the gas nozzles 31, 32, 41 and 42, gas injection holes are formed at a plurality of points, e.g., at a regular interval along the radial direction of the turntable 2. The nozzles 31, 32, 41 and 42 are arranged such that the spaced-apart distance between the lower edges of the nozzles 31, 32, 41 and 42 and the upper surface of the turntable 2 becomes equal to, e.g., about 1 to 5 mm.

The lower regions of the process gas nozzles 31 and 32 are a first processing region P1 where the source gas are adsorbed to the respective wafers W, and a second processing region P2 where the source gas adsorbed to the wafers W is nitrided to thereby form molecular layers of a reaction product composed of aluminum nitride. The separation gas nozzles 41 and 42 are used to form separation regions D. As shown in FIG. 2, bump portions 4 having a substantially sector-like shape are formed in the top plate 11 of the vacuum chamber 1 corresponding to the separation regions D. The separation gas nozzles 41 and 42 are arranged within groove portions formed in the bump portions 4.

Accordingly, low ceiling surfaces (first ceiling surfaces) serving as the lower surfaces of the bump portions 4 are arranged at the opposite sides of each of the separation gas nozzles 41 and 42 in the circumferential direction of the turntable 2 so as to prevent the respective process gases from being mixed with one another. Ceiling surfaces (second ceiling surfaces) higher than the low ceiling surfaces are arranged at the circumferential opposite sides of each of the low ceiling surfaces. In order to prevent the respective process gases from being mixed with one another, the peripheral edge portion of each of the bump portions 4 (the portion of each of the bump portions 4 existing near the outer edge of the vacuum chamber 1) is bent into an L-shape so as to face the outer end surface of the turntable 2 and so as to remain a little spaced apart from the chamber body 12.

As shown in FIGS. 1 and 2, a side ring 100 as a cover member is arranged at the outer peripheral side of the turntable 2 and at a position slightly lower than the turntable 2. The side ring 100 is provided to ensure that the inner wall of the vacuum chamber 1 is protected from the cleaning gas when a fluorine-based cleaning gas in place of the respective process gases is allowed to flow, e.g., during the apparatus cleaning time. In order for the side ring 100 to have corrosion resistance against the fluorine-based cleaning gas, the surface of the side ring 100 is coated with, e.g., an alumina and the like, or covered with a quartz cover.

On the upper surface of the side ring 100, exhaust ports 161 and 162 are formed at two points in a mutually spaced-apart relationship along the circumferential direction. The two exhaust ports 161 and 162 are respectively referred to as first exhaust port 161 and second exhaust port 162. The first exhaust port 161 is arranged between the first process gas nozzle 31 and the separation region D existing at the downstream side of the first process gas nozzle 31 along the rotation direction of the turntable 2 and is formed in a position lopsided toward the separation region D. The second exhaust port 162 is arranged between the second process gas nozzle 32 and the separation region D existing at the downstream side of the second process gas nozzle 32 along the rotation direction of the turntable 2 and is formed in a position lopsided toward the separation region D.

The first exhaust port 161 is used to discharge the first process gas and the separation gas. The second exhaust port 162 is used to discharge the second process gas and the separation gas. As shown in FIG. 1, the first exhaust port 161 and the second exhaust port 162 are respectively connected to a vacuum exhaust mechanism, e.g., a vacuum pump 164, through an exhaust pipe 163 in which a pressure regulator 165 such as a butterfly valve or the like is installed.

In a position where the second process gas supplied from the second process gas nozzle 32 flows out from the turntable 2, a groove-shaped gas flow path 101 for allowing the second process gas and the separation gas to pass therethrough is formed on the upper surface of the side ring 100.

As shown in FIGS. 1 and 2, a salient portion 150 is arranged in the central portion of the lower surface of the top plate 11. The salient portion 150 is formed into a substantially annular shape along the circumferential direction in a contiguous relationship with the regions of the bump portions 4 adjoining the central region C. The lower surface of the salient portion 150 has the same height as the lower surfaces (the first ceiling surfaces) of the bump portions 4. A labyrinth structure portion 110 for restraining the first process gas and the second process gas from being mixed with each other in the central region C is arranged above the core portion 21 positioned nearer to the rotation center of the turntable 2 than the salient portion 150.

As shown in FIG. 1, the labyrinth structure portion 110 includes a cylindrical first wall portion 111 extending vertically upward from the turntable 2 toward the top plate 11 and a double-cylinder-shaped second wall portion 112 extending vertically downward from the top plate 11 toward the turntable 2. Also, the labyrinth structure portion 110 is formed by inserting the first wall portion 111 into a groove formed between the double cylinders of the second wall portion 112. At this time, the respective wall portions 111 and 112 are arranged to ensure that gaps of about 1 mm exist between the surfaces of the respective wall portions 111 and 112, between the upper end of the first wall portion 111 and the lower surface of the top plate 11, and between the lower end of the second wall portion 112 and the upper surface of the turntable 2, respectively. This makes it possible to prevent the process gases from infiltrating from the processing regions P1 and P2 while avoiding interference with the rotating motion of the turntable 2.

In the meantime, the pressure within the central region C to which the $N_2$ gas (the separation gas) is supplied from the separation gas supply pipe 151 is set higher than the pressure of the processing regions P1 and P2. The $N_2$ gas supplied to the central region C flows into the processing regions P1 and P2 through the gap between the wall portions 111 and 112 of the labyrinth structure portion 110. By forming the stream of the separation gas, it is possible to restrain the process gases from infiltrating from one of the processing regions P1 and P2 into the other of the processing regions P1 and P2.

As shown in FIG. 1, a heater unit 7 as a heating mechanism is installed in a space existing between the turntable 2 and the bottom 14 of the vacuum chamber 1. The heater unit 7 is configured to heat the wafers W on the turntable 2 to, e.g., 300 degrees C., through the turntable 2. In FIG. 1, a cover member 71a is installed at one side of the heater unit 7, and a lid member 7a covers the upper side of the heater unit 7. In the bottom 14 of the vacuum chamber 1, purge gas supply pipes 73 for purging the arrangement space of the heater unit 7 at the lower side of the heater unit 7 are installed at a plurality of points along the circumferential direction.

As shown in FIG. 2, the transfer gate 15 for transferring the wafers W between the external transfer arm (not shown) and the turntable 2 is formed in the sidewall of the vacuum chamber 1. The transfer gate 15 is kept hermetically and can be opened or closed by a gate valve G. Further, the wafer W is transferred between the recess portion 24 of the turntable 2 and the transfer arm in the position facing the transfer gate 15. In the region corresponding to the transfer position at the lower side of the turntable 2, there are provided three delivery-purpose lift pins (not shown) penetrating the recess portion 24 to lift up the wafer W at the rear surface thereof, and a lift mechanism (not shown) for moving the lift pins up and down.

Further, the film formation apparatus of the present embodiment includes an ultraviolet irradiation unit 6 for irradiating ultraviolet rays on a molecular layer of aluminum nitride, a reaction product of the first and second process gases, in order to control the stresses generated in the AlN film formed on the wafer W.

As shown in FIGS. 1 and 2, the ultraviolet irradiation unit 6 includes a UV lamp 61 and a lamp box 62 for accommodating the UV lamp 61. The UV lamp 61 is formed of, e.g., a straight light-emitting tube. The UV lamp 61 is configured to emit ultraviolet rays having a wavelength of from 126 to 405 nm, e.g., 254 nm, using the electric power supplied from a power supply unit 63. The lamp box 62 includes a bottom plate 621 arranged on the lower surface thereof. The bottom plate 621 is capable of transmitting the ultraviolet rays and is made of, e.g., quartz glass. The ultraviolet rays emitted from the UV lamp 61 can be irradiated toward the lower surface of the lamp box 62.

The lamp box 62 is attached to the film formation apparatus by fitting the lamp box 62 into an opening formed in the top plate 11. As shown in FIG. 2, the lamp box 62 is provided between the second process gas nozzle 32 and the separation region D existing at the downstream side of the second process gas nozzle 32 along the rotation direction of the turntable 2 and is arranged in a position lopsided toward the separation region D. The distance between the wafer W on the turntable 2 and the UV lamp 61 is set such that stresses having a desired magnitude and a desired direction can be generated in the AlN film formed on the wafer W. The distance is decided in consideration of the energy amount of the ultraviolet rays irradiated from the UV lamp 61 per hour, the speed of the wafer W passing below the UV lamp 61, the ultraviolet ray transmittance of the bottom plate 621, and the like.

As shown in FIG. 1, the film formation apparatus of the present embodiment is connected to a control unit 120. The control unit 120 is formed of, e.g., a computer including a CPU and a storage unit 121. The storage unit 121 stores a program incorporating a step (command) group for the control associated with the operation of the film formation apparatus. The step group includes operations of loading the wafer W into the film formation apparatus, starting the supply of the respective process gases and the separation gas, rotating the turntable 2 and forming the AlN film. The storage unit 121 includes a storage medium, e.g., a hard disk, a compact disk, a magneto-optical disk or a memory card. The program is read from the storage medium and installed to the computer.

The description will now be made on an application example of the AlN film formed by the present film formation apparatus configured as above. According to the film formation apparatus of the present embodiment capable of controlling the stresses generated in the AlN film by using the ultraviolet irradiation unit 6, it is possible to form a stress liner film 90 on the surface of a FET formed on the substrate.

Figure 3:
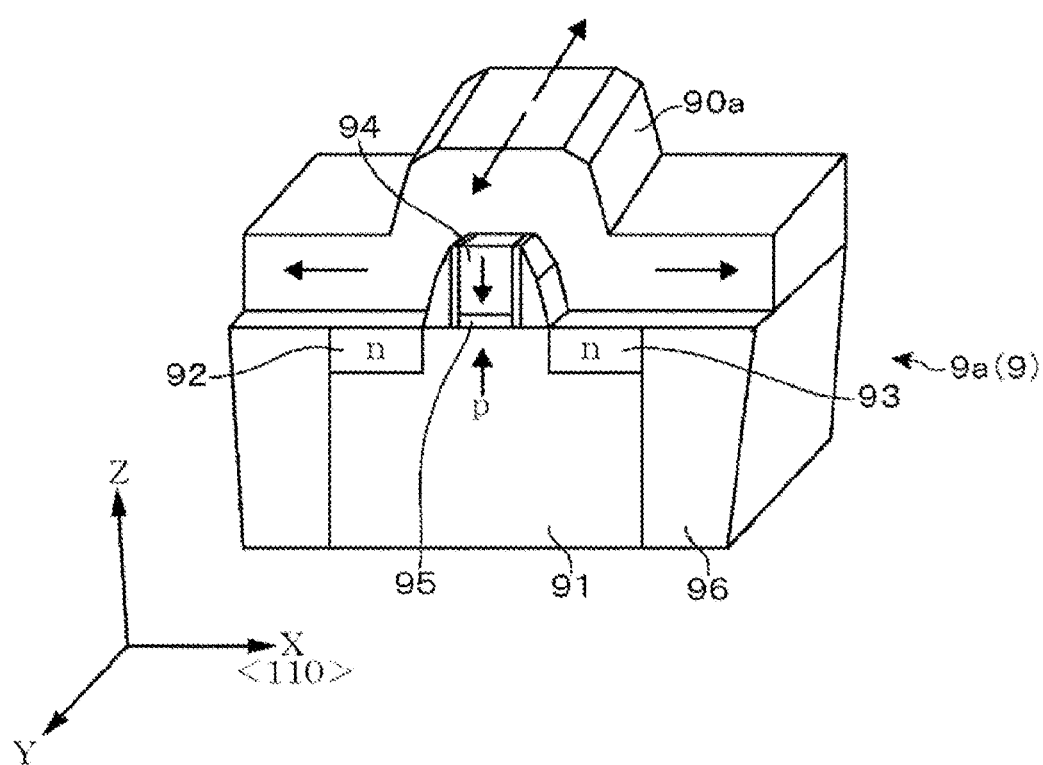
FIG. 3 is an explanatory view of a P-type FET on which a stress liner film is formed.
Figure 4:
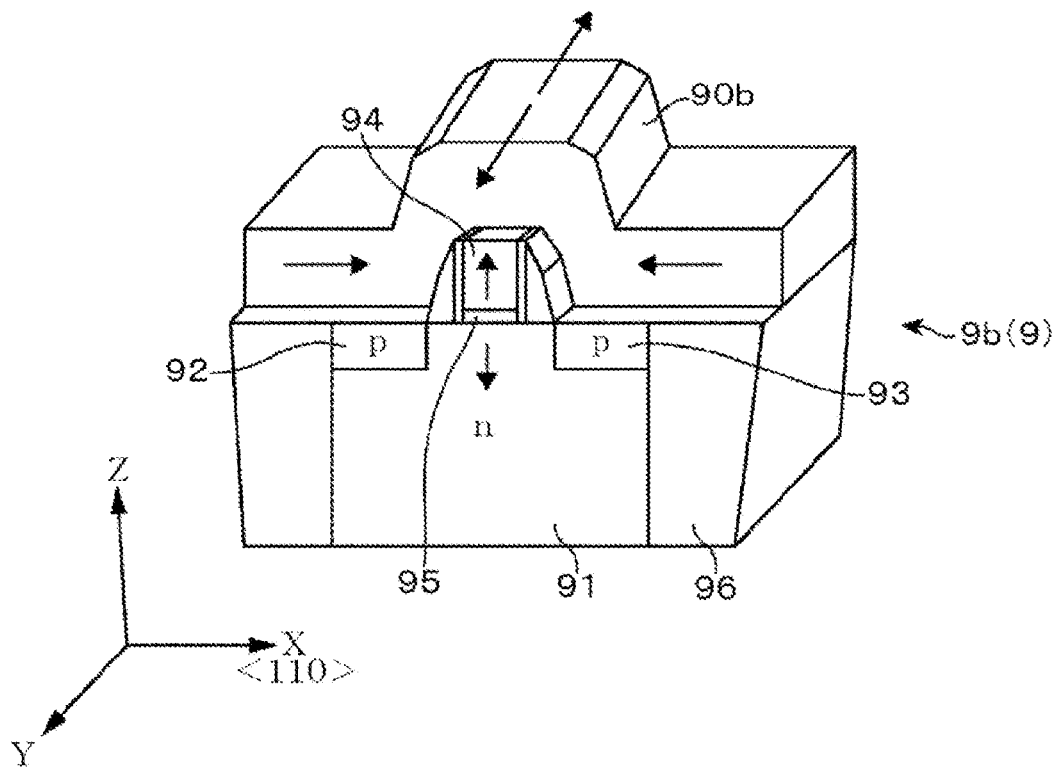
FIG. 4 is an explanatory view of an N-type FET on which a stress liner film is formed.

As shown in FIGS. 3 and 4, the stress liner film 90 is formed on a P-type FET 9a or an N-type FET 9b used in a logic circuit. In this case, if the <110> direction is assumed to be an x-axis, a stress liner film 90a for applying tensile stresses in the x-axis and y-axis directions and applying compressive stresses in the z-axis direction is preferred with respect to the P-type FET 9a. Further, a stress liner film 90b for applying compressive stresses in the x-axis direction and applying compressive stresses in the y-axis and z-axis directions is suitable for the N-type FET 9b. The respective figures include the substrate 91, a source region 92, a drain region 93, a gate electrode 94, an insulating film 95, and an isolation region 96.

Figure 5A:
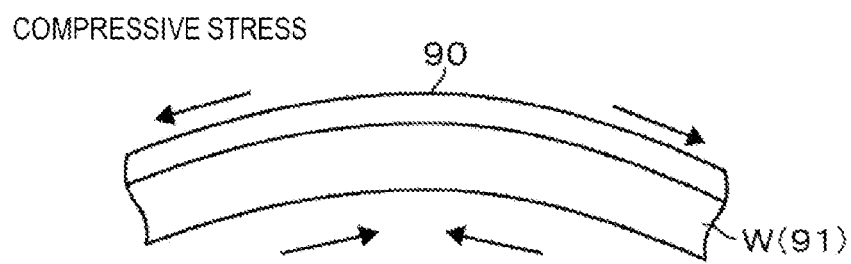
FIGS. 5A and 5B are explanatory views illustrating a direction of stresses applied to a wafer by the stress liner film.
Figure 5B:
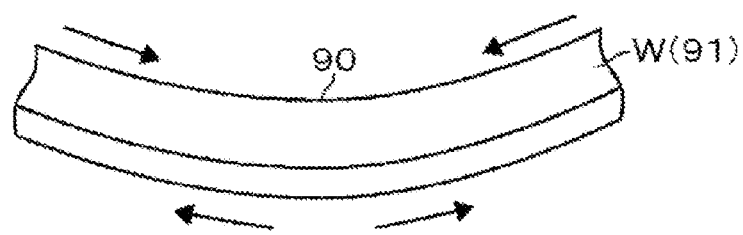

As shown in FIG. 5A, the compressive-stress-type stress liner film 90 generates tensile stresses in itself, thereby applying compressive stresses to the wafer W (substrate 91). On the other hand, as shown in FIG. 5B, the tensile-stress-type stress liner film 90 generates compressive stresses in itself, thereby applying tensile stresses to the wafer W (substrate 91).

As described, the stress liner film 90 has been formed on the conventional planar FET 9 shown in FIGS. 3 and 4 using the plasma CVD. However, in case where the stress liner film 90 is formed so as to cover a gate electrode 95a extending along the surface of a fin 97 (protrusion portion) having a large level difference formed on the surface of a substrate 91 (a Si substrate) as in a Fin-FET 9c shown in FIG. 6, the conventional plasma CVD may not provide coating performance with the sufficient level difference.

By forming the AlN film with the ALD method, the film formation apparatus of the present embodiment can realize coating performance with a high level difference and can control the tensile stresses generated in the AlN film to such an extent that the AlN film can be used as the stress liner film 90 as in the Examples to be described later. The description will now be made on the operation of the film formation apparatus.

Referring to FIGS. 1 and 2, the gate vale G is first opened. While intermittently rotating the turntable 2, a plurality of wafers W, e.g., five wafers are placed on the turntable 2 through the transfer gate 15 by a transfer arm (not shown). The FET 9 is formed on the surface of each of the wafers W by a dry etching process or a CVD method. Then, the gate valve 244 is closed. The inside of the vacuum chamber 1 is brought into a vacuum state by the vacuum pump 164. While rotating the turntable 2 clockwise, the wafers W are heated to about 100 to 400 degrees C. by the heater unit 7.

Subsequently, the source gas (first process gas) containing Al and the $NH_3$ gas (second process gas) are injected from the process gas nozzles 31 and 32, respectively. The separation gas is injected from the separation gas nozzles 41 and 42 at a specified flow rate. The $N_2$ gas is injected at a specified flow rate from the separation gas supply pipe 151 and the purge gas supply pipes 72 and 73. Also, electric power is applied to the UV lamp 61, thereby allowing the UV lamp 61 to emit ultraviolet rays. Then, the internal pressure of the vacuum chamber 1 is regulated to a predetermined processing pressure by the pressure regulating unit 165.

Then, if the turntable 2 is rotated at a specified rotation speed as shown in FIG. 8, the wafers W on the turntable 2 revolve around the rotating shaft 22. In the first processing region P1, the source gas supplied from the first process gas nozzle 31 flows toward the downstream side along the rotation direction of the turntable 2 in response to the rotation operation of the turntable 2. Then, the source gas is discharged through the exhaust port 161. On the other hand, in the second processing region P2, the $NH_3$ gas supplied from the second process gas nozzle 32 flows toward the downstream side along the rotation direction of the turntable 2 in response to the rotation operation of the turntable 2 and flows into the gas flow path 101. Then, the $NH_3$ gas is discharged through the exhaust port 162.

In the meantime, the first processing region P1 and the second processing region P2 are separated from each other by the separation regions D, the central region C and the $N_2$ gas (the separation gas) supplied to the separation regions D and the central region C. This restrains the process gases from being mixed with each other in the respective processing regions P1 and P2, thereby restraining a reaction product from being deposited in the regions other than the surfaces of the wafers W as film formation targets.

Observing the wafers W on the turntable 2, the source gas containing Al is adsorbed to the surfaces of the wafers W in the first processing region P1. In the second processing region P2, the source gas adsorbed to the surfaces of the wafers W reacts with the $NH_3$ gas, whereby one or more AlN molecular layers as reaction products are formed on the surfaces of the wafers W. Thereafter, when the wafers W having the molecular layers formed thereon pass below the UV lamp 61, the ultraviolet rays are irradiated on the molecular layers.

Upon irradiating the ultraviolet rays on the molecular layers, the molecular layers absorb the energy of the ultraviolet rays, thereby destroying the chemical bond of the unreacted gas (e.g., TMA or $NH_3$) or the intermediate gas (e.g., $CH_3$—$NH_3$) introduced into the molecular layers, or detaching carbon atoms or hydrogen atoms existing in the film. This increases the density of the molecular layers. As these substances are desorbed from the molecular layers, there are generated stresses acting in such a direction as to contract the molecular layers. When the molecular layers having such stresses are deposited, it is possible to form the stress liner film 90 that applies tensile stresses to the wafers W as shown in FIG. 5B. Needless to say, there may be a case that it is necessary for the stress liner film 90 to apply compressive stresses as shown in FIG. 5A. In this case, it is possible to employ, e.g., a film formation method using a plasma generation unit 8. The details of this film formation method will be described later.

As mentioned above, while the turntable 2 makes one revolution, the step of supplying the source gas, the step of supplying the $NH_3$ gas and the step of irradiating the ultraviolet rays are performed in the named order with respect to the wafers W. Consequently, as schematically shown in FIGS. 7A to 7E, an untreated molecular layer 901 not subjected to ultraviolet treatment is formed on the surfaces of the wafers W (see FIG. 7A). Thereafter, the ultraviolet rays are irradiated on the untreated molecular layer 901, thereby forming an ultraviolet-treated molecular layer 902 (see FIG. 7B).

As a plurality of ultraviolet-treated molecular layers 902 is deposited by repeating the formation of the untreated molecular layer 901 and the irradiation of the ultraviolet rays in this manner (see FIGS. 7C and 7D), it is possible to form the stress liner film 90 whose inner portion is treated with the ultraviolet rays.

In the meantime, when an AlN film is formed by, e.g., a CVD method or an ALD method and then the stresses generated in the AlN film are controlled by irradiating ultraviolet rays on the AlN film, the ultraviolet ray irradiation affects only the surface region of the AlN film. Thus, the stress-controllable range may become narrow.

Figure 6:
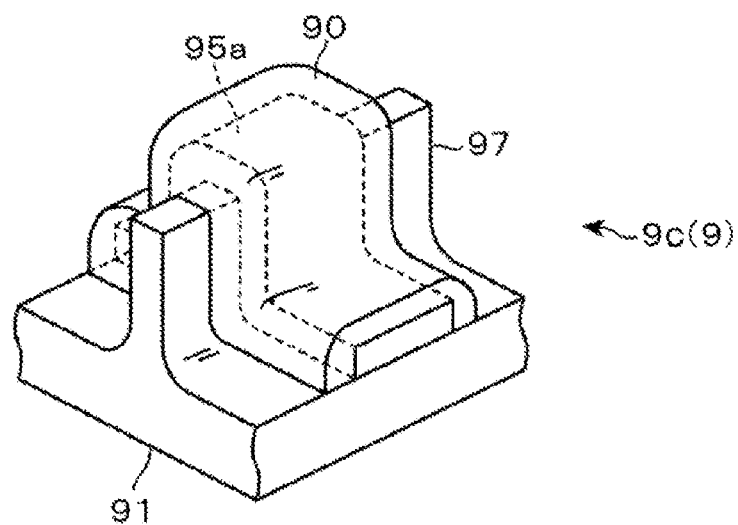
FIG. 6 is an explanatory view showing a state that the stress liner film is formed on a protrusion portion of a three-dimensional FET.
Figure 7A:
FIGS. 7A to 7E are explanatory views showing a state that molecular layers are being deposited on a wafer.
Figure 7B:
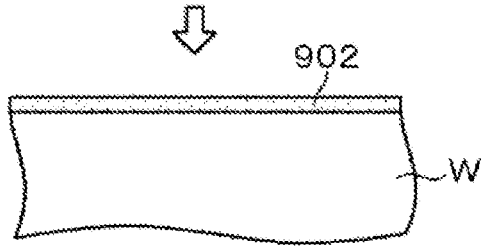
Figure 7C:
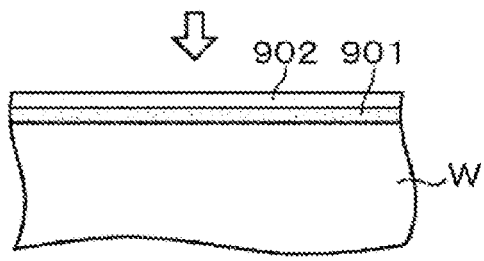
Figure 7D:
Figure 7E:
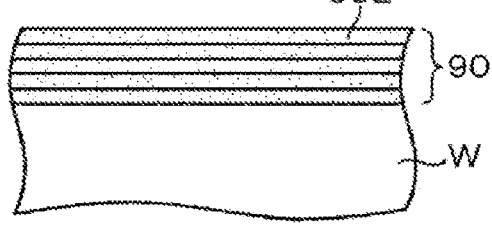

The AlN film is formed by depositing the reaction product generated from the source gas adsorbed to the surfaces of the wafers W. In this case, even if a three-dimensional FET 9 (9c) includes a protrusion portion (a fin 97) having a large level difference as shown in FIG. 6, it is possible to form the stress liner film 90 having coating performance with a high level difference along the wall surfaces of the protrusion portion. However, the wafers W on which the stress liner film 90 can be formed by the present film formation apparatus are not limited to the ones having a three-dimensional transistor but may be the wafers W having a conventional planar FET 9 (9a or 9b).

After the formation of the AlN film is performed for a specified time in this manner, the injection of the source gas and the $NH_3$ gas from the process gas nozzles 31 and 32 and the injection of the separation gas from the separation gas nozzles 41 and 42 are stopped. The rotation of the turntable 2 is stopped. Then, the heating of the wafers W by the heater unit 7 is stopped. The internal pressure of the vacuum chamber 1 is regulated to a pressure at which the wafers W can be unloaded. The gate valve G is opened and the wafers W are taken out from the transfer gate 15. Accordingly, the film formation process is completed.

The film formation apparatus according to the present embodiment provides the following effects. When the AlN film is obtained by depositing the AlN molecular layers on the wafers W placed on the turntable 2 using the ALD method, the ultraviolet rays are irradiated on the molecular layers. This makes it possible to control the stresses generated in the AlN film.

In this regard, when forming the AlN film through the use of the aforementioned film formation apparatus, it is not essential that the ultraviolet rays are irradiated on all of the molecular layers. The stresses generated in the AlN film may be controlled by not irradiating the ultraviolet rays on some of the molecular layers.

Figure 10:
FIG. 10 is a schematic view of a stress liner film formed by the method illustrated in the above time chart.

FIGS. 9A to 9D are time charts chronologically illustrating the content of the processes performed with respect to one of the wafers W placed on the turntable 2. In a normal cycle that the ultraviolet rays are irradiated, the process of supplying the source gas to the wafers W (see FIG. 9A), the process of supplying the $N_2$ gas (separation gas) (see FIG. 9C), the process of supplying the $NH_3$ gas (see FIG. 9B), the process of irradiating the ultraviolet rays (see FIG. 9D) and the process of supplying the $N_2$ gas (separation gas) (see FIG. 9C) are performed one after another. Consequently, as shown in FIG. 10, the ultraviolet-treated molecular layers 902 are formed on the surfaces of the wafers W.

On the other hand, in a cycle that the ultraviolet rays are not irradiated, the irradiation of the ultraviolet rays on the untreated molecular layers 901 formed on the wafers W is not performed at the timing illustrated in FIG. 9D. The deposition of the next molecular layer is started with the untreated molecular layers 901 kept intact. In this manner, the ultraviolet rays are not irradiated on the n molecular layers among the m molecular layers (where m and n are natural numbers having a relationship of m>n). Accordingly, as shown in FIG. 10, it becomes possible to deposit the untreated molecular layers 901 and the ultraviolet-treated molecular layers 902 in a desired order. In the stress liner film 90c shown in FIG. 10, the irradiation of the ultraviolet rays is not performed with respect to one of two molecular layers.

As a method of making sure that the irradiation of the ultraviolet rays is not performed at a specified interval with respect to the wafers W placed on the turntable 2 and rotated by the turntable 2, it can be contemplated that the UV lamp 61 is turned off during a cycle of predetermined order when the wafers W pass below the UV lamp 61. Further, an opening/closing shutter may be installed below the UV lamp 61 and the irradiation/non-irradiation of the ultraviolet rays may be controlled by the opening/closing operation of the shutter.

Instead of controlling the timings of irradiation/non-irradiation of the ultraviolet rays, the irradiation intensity of the UV lamp 61 may be increased or decreased to change the amount of the irradiated ultraviolet rays on a layer-by-layer basis, thereby controlling the stresses generated in the stress liner film. For example, the irradiation intensity of the UV lamp 61 may be increased from the lower layer side toward the upper layer side along the deposition direction of the molecular layers. Conversely, the irradiation intensity of the UV lamp 61 may be decreased from the lower layer side toward the upper layer side. Based on a plan made in advance, the amount of the ultraviolet rays irradiated on the respective molecular layers may be appropriately increased or decreased.

Further, the kind of the film that makes it possible to control the stresses generated in the thin film using the ultraviolet irradiation unit 6 installed in the film formation apparatus described in respect of the aforementioned embodiment is not limited to the AlN film. For example, a SiN film can provide the same effect as provided by the AlN film. When forming the SiN film, a source gas containing silicon (Si), such as dichlorosilane (DCS) or hexachlorodisilane (HCD), is used as the first process gas. The $NH_3$ gas or the like is used as a gas for nitriding the first process gas.

Next, the description will be made on a second application example of the stress liner film formed by the present film formation. In place of the aforementioned AlN film, the formation of a SiN film will be described herein. However, the content of the processes performed with respect to the AlN film is the same as that of the SiN film except the process gas and the etching gas.

In the second application example, when forming a SiN film for use in the double patterning described in the Background, the stresses generated in the SiN film is controlled using the film formation apparatus of the present embodiment.

Figure 11:
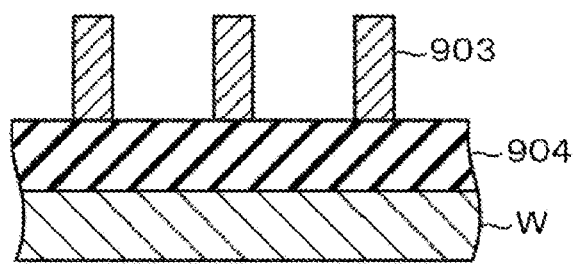
FIG. 11 is a first explanatory view of double patterning.
Figure 12:
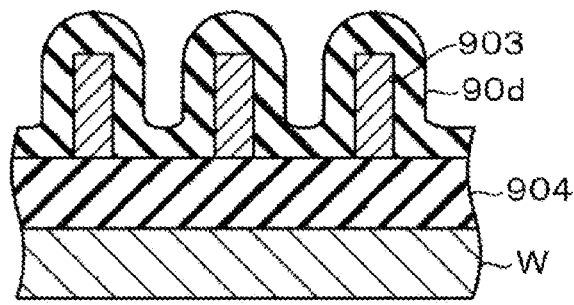
FIG. 12 is a second explanatory view of double patterning.
Figure 13:
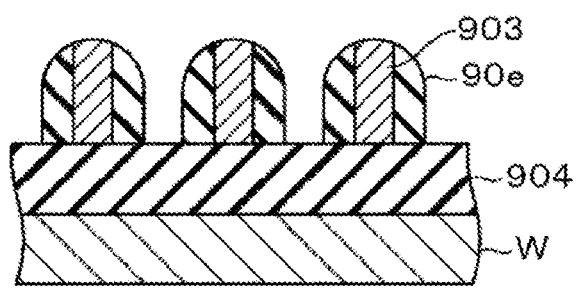
FIG. 13 is a third explanatory view of double patterning.

First, the double patterning performed using sidewalls will be briefly described with reference to FIGS. 11 to 15. As shown in FIG. 11, the description will be made on a case that the double patterning of a process target film 904 is performed with respect to the wafer W in which the process target film 904 composed of, e.g., a $SiO_2$ film, is formed on the surface of the wafer W and in which a linear mask pattern having mask portions 903 made of amorphous silicon is formed on the upper surface of the process target film 904.

The wafer W mentioned above is loaded into the film formation apparatus of the present embodiment. A SiN film 90d is formed on the surface of the wafer W (see FIG. 12). Thereafter, a mixture gas of, e.g., a $CF_4$ gas, a $CHF_3$ gas, an Ar gas, an $O_2$ gas, a $CH_2F_2$ gas and an $F_2$ gas is turned into plasma, thereby performing anisotropic etching. Thus, the SiN film 90d is etched downward. As a result, the upper ends of the mask portions 903 are exposed and the upper surface of the process target film 904 is exposed in between the adjoining mask portions 903. The deposition portions making contact with the opposite side surfaces of each of the mask portions 903 remain as sidewalls 90e (see FIG. 13).

Figure 14:
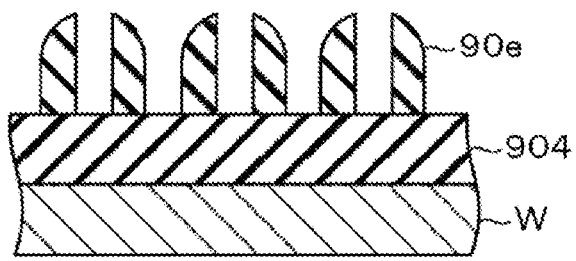
FIG. 14 is a fourth explanatory view of double patterning.
Figure 15:
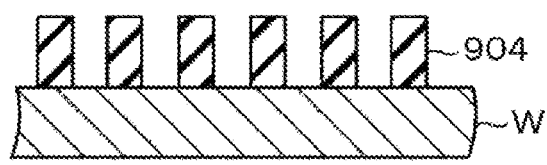
FIG. 15 is a fifth explanatory view of double patterning.

Then, the mask portions 903 made of amorphous silicon are removed by turning, e.g., an $O_2$ gas and an HBr gas to plasma (see FIG. 14). Thereafter, using the sidewalls 90e left on the wafer W as new mask portions, an Ar gas and a $C_4F_8$ gas are turned into plasma to thereby etch the process target film 904. Then, a mixture gas of a $CF_4$ gas, a $CHF_3$ gas, an Ar gas, an $O_2$ gas, a $CH_2F_2$ gas and an $F_2$ gas is turned into plasma, thereby removing the sidewalls 90e. Consequently, there is provided a process target film 904 patterned at an interval narrower than the interval of the mask portions 903 (see FIG. 15).

Figure 16:
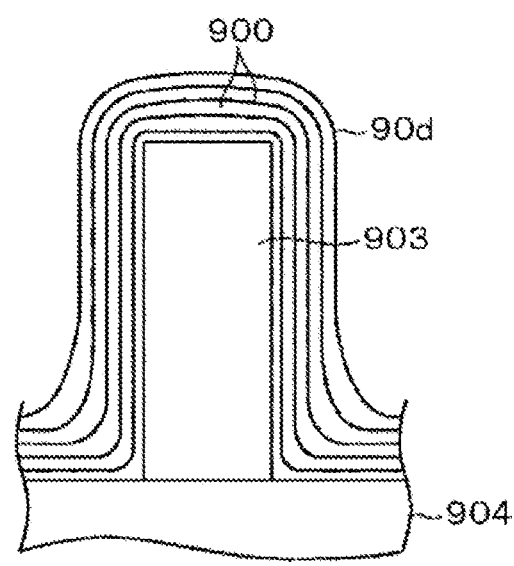
FIG. 16 is a schematic view of an AlN film formed on the surface of a mask portion during the double patterning.

If the sidewalls 90e are formed by depositing SiN on the mask portions 903 in the aforementioned double patterning process, the upper end portions of the sidewalls 90e have a tapering shoulder shape as shown in FIG. 14. On the other hand, the SiN film 90d formed by the ALD method is formed by depositing SiN molecular layers 900 as schematically shown in FIG. 16.

Figure 17:
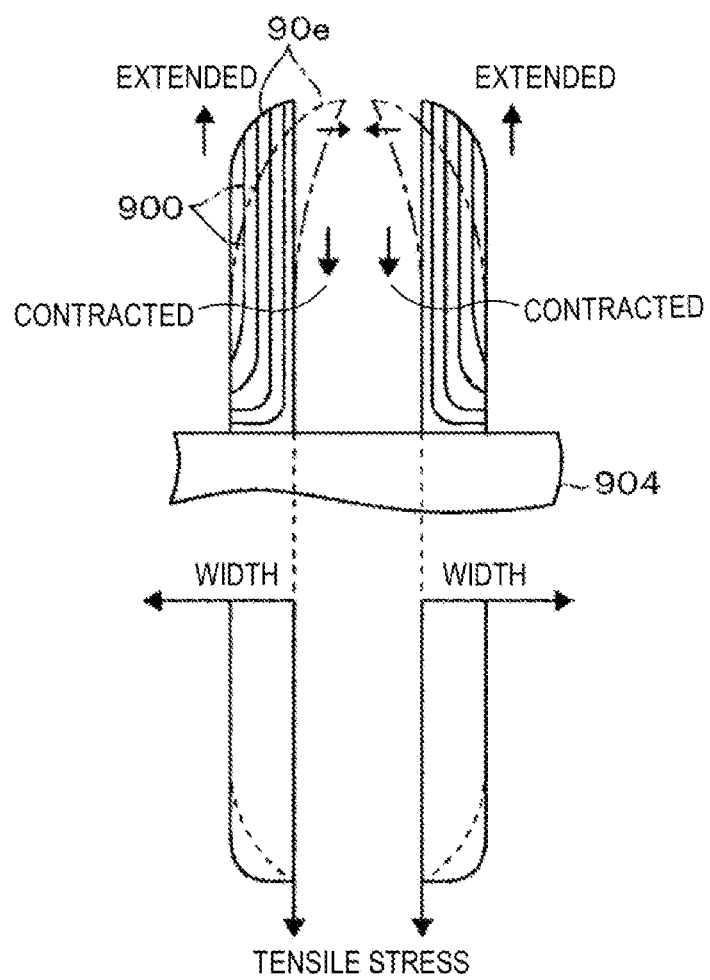
FIG. 17 is a schematic view of sidewalls formed from the AlN film.

At this time, the molecular layers 900 having uniform stresses per unit area are deposited by controlling the stresses through the use of the ultraviolet irradiation unit 6. In this state, the sidewalls 90e having a shoulder shape are formed by etching the SiN film 90d and removing the mask portions 903. Then, the stress distribution indicated by broken lines in the graph shown in FIG. 17 is created due to the magnitude and difference of the stress values of the initially-formed molecular layer 900 existing in the interface with the mask portions 903 and the outer molecular layer 900 and due to the shoulder shape.

As can be seen in the stress distribution indicated by broken lines, the stresses acting on the sidewalls 90e become smaller at the outer side of each of the sidewalls 90e and become larger at the inner side of each of the sidewalls 90e which had made contact with the mask portion 903. In this case, the balance of the stresses acting on each of the sidewalls 90e is destroyed. As a result, the sidewalls 90e may be collapsed inward as indicated by single-dot chain lines in FIG. 17.

For the reasons stated above, the UV lamp 61 shown in FIGS. 1 and 2 is endowed with, e.g., a light control function by which the amount of electric power supplied from the power supply unit 63 is increased or decreased to thereby respectively increase or decrease the emission amount of ultraviolet rays. The UV lamp 61 controls the irradiation amount in such a way that the amount of the ultraviolet rays irradiated on the molecular layers 900 becomes larger at the outer side of the SiN film 90d shown in FIG. 16 (at the upper layer side when seen in the deposition order) and becomes smaller at the inner side of the SiN film 90d (at the lower layer side when seen in the deposition order). As a consequence, in the sidewalls 90e shown in FIG. 17, the stresses acting on the outer molecular layer 900 grow larger so as to become equal to the stresses acting on the inner molecular layer 900. Thus, the distribution of the stresses acting on the stress liner film 90 becomes uniform in the width direction of the stress liner film 90 (as indicated by solid lines in the graph shown in FIG. 17). As a result, the balance of the stresses is maintained. This makes it possible to restrain the sidewalls 90e from being collapsed.

Figure 18:
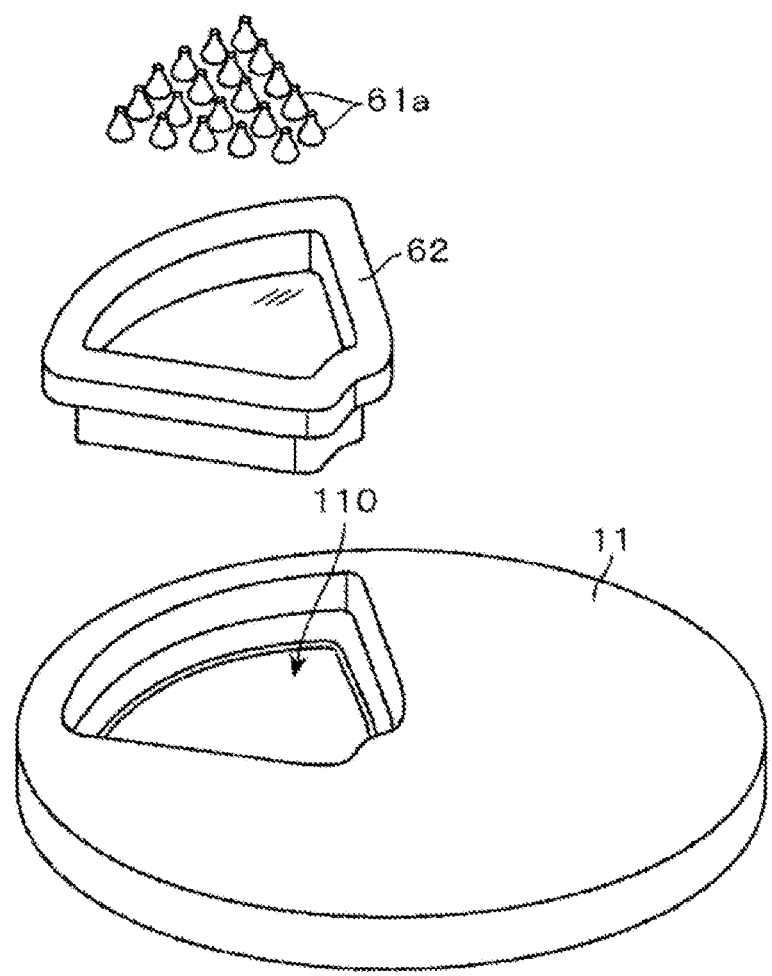
FIG. 18 is an exploded perspective view of a film formation apparatus provided with bulb-type UV lamps.
Figure 19:
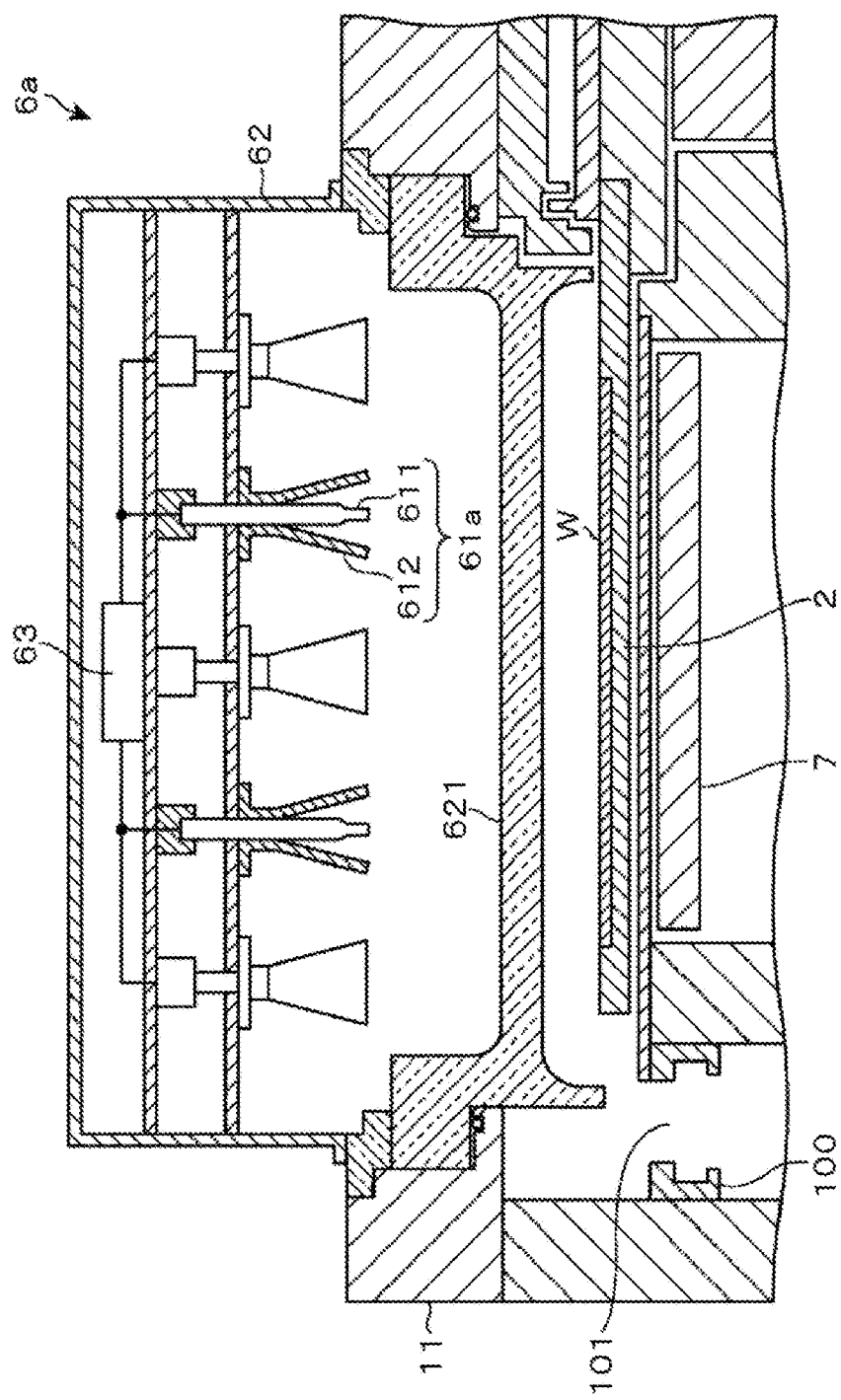
FIG. 19 is a partially enlarged vertical sectional side view of the film formation apparatus provided with the bulb-type UV lamps.

The description made above is directed to the application examples in which the stress liner film 90 for the increase of the operation speed of an FET and the sidewalls 90e used as masks during the double patterning are formed by the AlN film or the SiN film through the use of the film formation apparatus provided with the ultraviolet irradiation unit 6. In this regard, the light-emitting tube installed in the ultraviolet irradiation unit 6 is not limited to the straight type but may be a bulb type. FIGS. 18 and 19 show an ultraviolet irradiation unit 6a in which a plurality of UV lamps 61a each having a lamp bulb 611 is arranged.

Each of the UV lamps 61a includes a lamp bulb 611 and a lamp shade 612. The UV lamps 61a are arranged in a sector-like pattern in a region between the ultraviolet irradiation unit 6 and the separation region D existing at the downstream side of the ultraviolet irradiation unit 6 as shown in a plan view of FIG. 8. In the ultraviolet irradiation unit 6a of the present embodiment, a lamp box 62 provided with a bottom plate 621 capable of transmitting ultraviolet rays is fitted into the opening of a top plate 11. The UV lamps 61a are arranged within the lamp box 62. As installing the UV lamps 61a and by adjusting the lighting region of the UV lamps 61a (e.g., the width of the sector-like region in which the UV lamps 61a are lit), the lighting lamp number (the ratio of the UV lamps 61a turned on and the UV lamps 61a turned off) and the light emission intensity per UV lamp 61a, it is possible to increase or decrease the amount and density of the energy irradiated on the molecular layers. This makes it possible to flexibly control the stresses generated in the AlN film or the SiN film.

Next, in the film formation apparatus in which the AlN film or the SiN film is formed on the wafer W by rotating the turntable 2 within the vacuum chamber 1, a method of controlling the stresses generated in the film using a plasma generation unit 8 in place of the aforementioned ultraviolet irradiation unit 6 will be described with reference to FIGS. 20 and 21.

Figure 21:
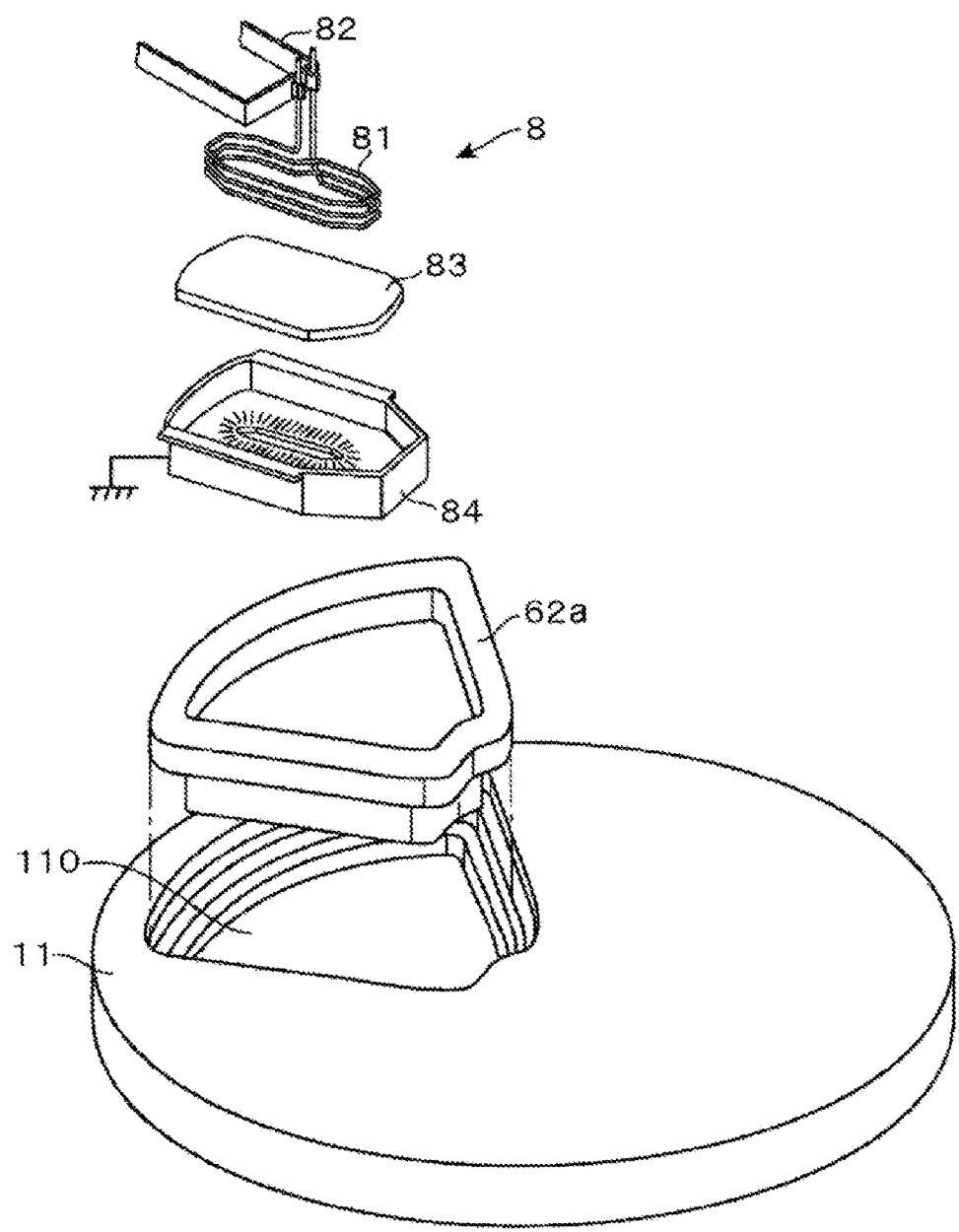
FIG. 21 is an exploded perspective view of the film formation apparatus provided with the plasma generation unit.

As shown in an exploded perspective view of FIG. 21, the plasma generation unit 8 is formed of an inductively coupled plasma generator that includes an antenna 81 connected to an electrode 82 and wound in a coil shape, a Faraday shield 84 installed to selectively attenuate electric field from electric fields and magnetic field generated by the antenna 81 and an insulating plate 83 installed between the antenna 81 and the Faraday shield 84 to insulate the antenna 81 and the Faraday shield 84 from each other, the insulating plate 83 being made from, e.g., a quartz plate.

Figure 20:
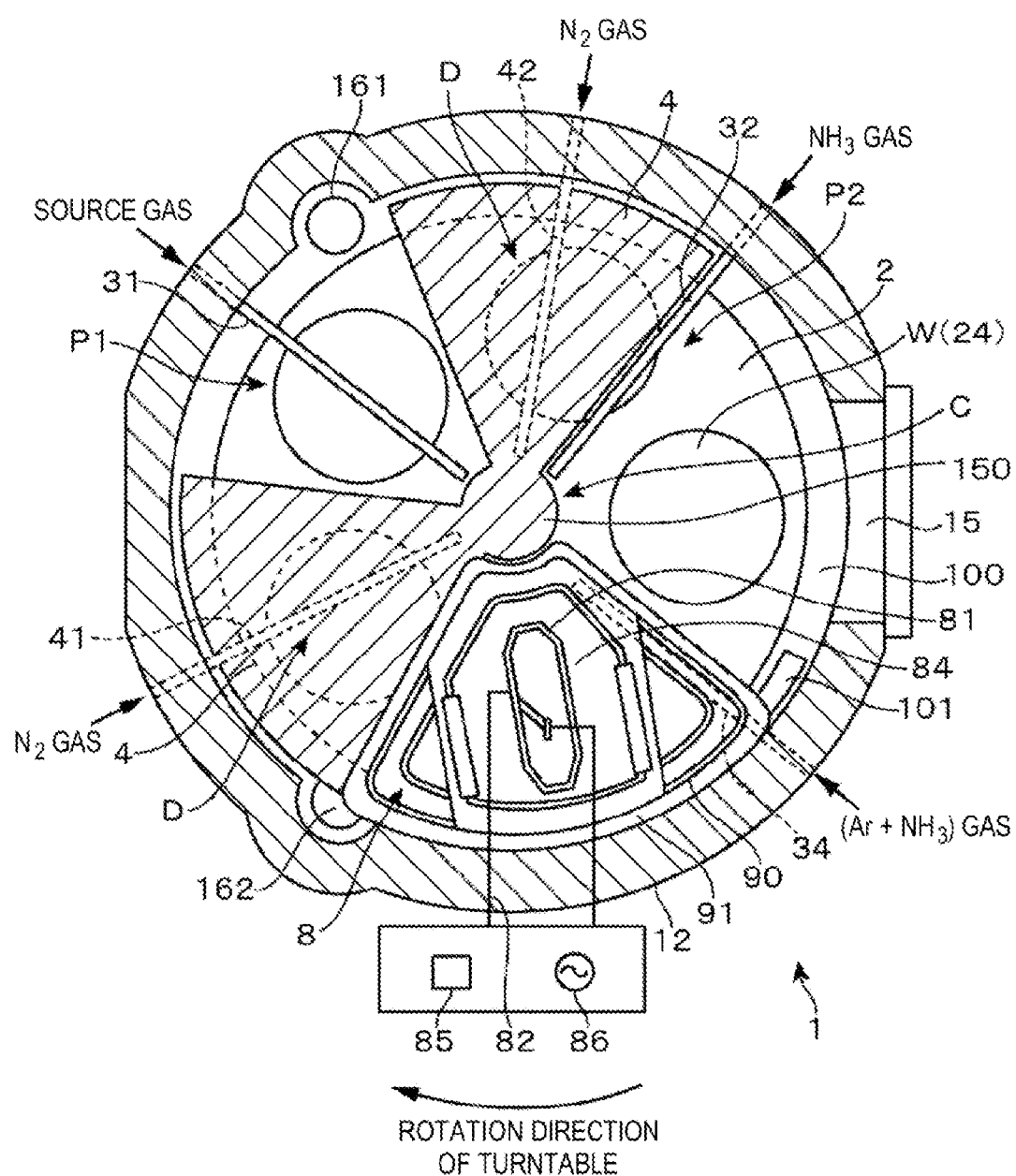
FIG. 20 is a horizontal sectional plan view of a film formation apparatus provided with a plasma generation unit.

The plasma generation unit 8 is accommodated within a sector-like box 62a and is arranged ahead of the separation region D existing at the downstream side of the second process gas nozzle 32 as shown in FIG. 20. Below the side edge portion of the box 62a existing in the upstream position along the rotation direction of the turntable 2, there is provided a plasma-generating gas nozzle 34 extending in the radial direction of the turntable 2 along the side edge portion. A mixture gas of an Ar gas, an $NH_3$ gas and a hydrogen gas, or a mixture gas of an Ar gas and an $N_2$ gas, is supplied from the plasma-generating gas nozzle 34. A high-frequency electric current of, e.g., 13.56 MHz, is applied from a high-frequency power supply 86 to the Faraday shield 84 through a matching box 85. Then, the mixture gas is turned into plasma under the influence of overcurrent generated by the variable magnetic fields supplied from the plasma generation unit 8.

If the gas turned into plasma in this manner is brought into contact with AlN molecular layers or SiN molecular layers, active nitrogen atoms or active hydrogen atoms are introduced into the molecular layers. This makes it possible to generate stresses acting in such a direction as to expand the molecular layers. By depositing the molecular layers having such stresses one above another, it is possible to form a thin film that applies compressive stresses to the wafer W as shown in FIG. 5A.

In the meantime, if the ultraviolet rays are irradiated on the AlN molecular layers or the SiN molecular layers, the ultraviolet rays destroy the chemical bond of the unreacted gas (e.g., TMA or $NH_3$) or the intermediate gas (e.g., $CH_3$—$NH_3$) introduced into the molecular layers, or detach carbon atoms or hydrogen atoms existing in the film. This increases the density of the molecular layers. As these substances are detached from the molecular layers, there are generated stresses acting in such a direction as to contract the molecular layers. By depositing the molecular layers having such stresses, it is possible to form a thin film that applies the tensile stresses to the wafer W as shown in FIG. 5B.

As set forth above, the provision of the ultraviolet irradiation unit 6 in the film formation apparatus makes it possible to control the stresses generated in the thin film so that the AlN film or the SiN film can have tensile stresses. The provision of the plasma generation unit 8 in the film formation apparatus makes it possible to control the stresses generated in the thin film so that the AlN film or the SiN film can have compressive stresses. Accordingly, if the ultraviolet irradiation unit 6 and the plasma generation unit 8 are installed in one film formation apparatus, it is possible to provide a film formation apparatus capable of controlling the direction and magnitude of the stresses generated in the AlN film or the SiN film.

EXAMPLES

An ultraviolet irradiation or other treatment was performed with respect to an AlN film formed on a wafer W. Then, the stresses generated in the AlN film were measured.

A. Test Conditions (1) Ultraviolet irradiation, (2) plasma treatment and (3) heat treatment were performed with respect to an AlN film of 50 nm in thickness formed by an ALD method (using TMA as a source gas and $NH_3$ as a nitriding gas). Then, the stresses generated in the AlN film were measured.

Figure 22:
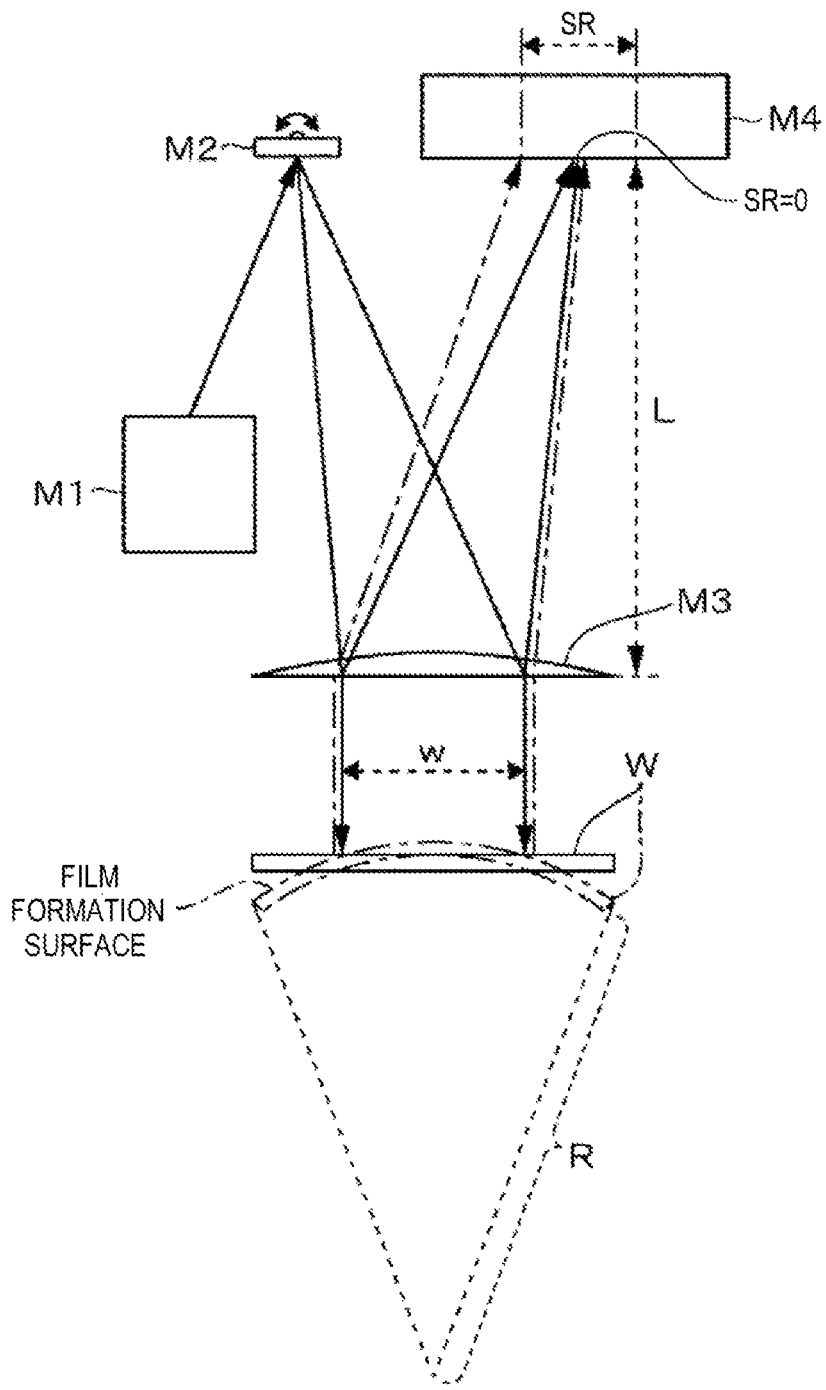
FIG. 22 is a view explaining the principle of a stress measuring instrument used in Examples.

As shown in FIG. 22, the measurement of the stresses is conducted by allowing a reflection mirror M2 to reflect the laser light emitted from a laser light source M1, irradiating the laser light on a wafer W through a lens M3 and detecting a position where the laser light reflected from the wafer W is incident on a position sensor M4. The reflection mirror M2 is rotatable around a pivot shaft and is capable of scanning a laser light irradiation position within a scan range indicated by w in FIG. 22. The positional relationship between the lens M3 and the position sensor M4 is set to ensure that the laser light reflected from the planar wafer W is converged on one point in the focal position of the lens M3 and is incident on the position sensor M4.

In the meantime, if an AlN film for applying compressive stresses to the wafer W is formed on the front surface of the wafer W on which the laser light is irradiated, a warp is generated in the wafer W as indicated by a single-dot chain line in FIG. 22. As a result, there is generated a shift in the position where the laser light reflected from the wafer W is incident on the position sensor M4. Thus, the distance between the incidence position of the laser light reflected from one end portion of the scan range and the incidence position of the laser light reflected from the other end portion of the scan range is increased to SR. Conversely, if an AlN film for applying tensile stresses to the wafer W is formed on the front surface of the wafer W, a warp is generated in a direction opposite to the direction indicated by a single-dot chain line in FIG. 22. As a result, the incidence positions of the laser light reflected from one end portion and the other end portion of the scan range are shifted in a direction opposite to the direction shown in FIG. 22. The distance between the incidence positions becomes equal to SR.

Based on the detection result of the distance SR detected by the position sensor M4, the curvature radius R of the wafer W is calculated by the following equation (1). The warping direction of the wafer W is grasped from the shift direction of the laser light incident on the position sensor M4.

$$R = 2Lw/SR \quad \text{Eq. (1)}$$

where R is the curvature radius of the wafer W, L is the focal length of the lens M3, SR is the distance between the incidence positions of the laser light detected by the position sensor M4, and w is the scan distance of the laser light.

Then, the stress σ of the AlN film is calculated by the following equation (2) (Stoney equation).

$$\sigma = (E_S t_S^2)/\{6(1-\nu_S)R t_F\} \quad \text{Eq. (2)}$$

where $E_S$ is the Young's modulus of the wafer W, $\nu_S$ is the Poisson's ratio of the wafer W, $t_S$ is the thickness of the wafer W, and $t_F$ is the thickness of the AlN film.

Example 1-1

The wafer W was heated to 400 degrees C. under a vacuum atmosphere of 399 Pa. In the height position spaced apart by 40 to 100 mm from the surface of the wafer W, ultraviolet rays of 254 nm in wavelength and 0.3 W in output power were irradiated on the AlN film for 600 seconds. Thereafter, the stresses of the AlN film were measured.

Example 1-2

As compared with Example 1-1, the heating temperature of the wafer W was changed to 350 degrees C. Further, the wavelength and the output power of the ultraviolet rays irradiated on the AlN film were changed to 405 nm and 0.7 W.

Example 2-1

In a capacitively-coupled plasma apparatus including an upper electrode and a lower electrode formed of parallel flat plates arrange within a vacuum chamber, a wafer W was placed on the lower electrode. While regulating the internal pressure of the vacuum chamber at a pressure of 666.7 Pa, an Ar gas was supplied at a flow rate of 1.6 slm (standard liters (0 degree C. and 1 atm)/min, which applies in the following description). A hydrogen gas was supplied at a flow rate of 2.0 slm. An $NH_3$ gas was supplied at a flow rate of 1.5 slm. Electric power of 450 kHz and 800 W was applied to the upper electrode and the lower electrode to generate plasma. The wafer W was subjected to plasma treatment for 60 seconds. Thereafter, the stresses of an AlN film were measured.

Example 2-2

As compared with Example 2-1, the gases supplied were changed to an Ar gas of 1.6 slm and an N2 gas of 1.6 slm.

Comparative Example

Under a vacuum atmosphere of 133 Pa, a wafer W was heated at 500 degrees C. for two hours. Thereafter, the stresses of an AlN film were measured.

Reference Example

Figure 23:
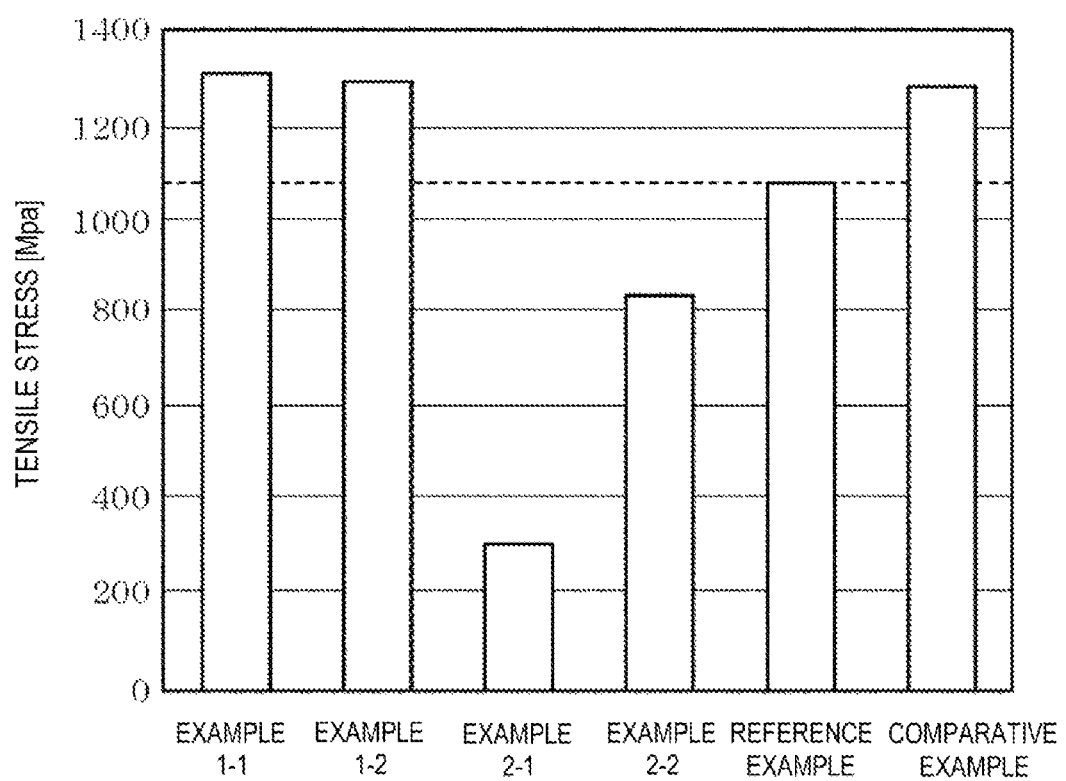
FIG. 23 is an explanatory view showing the results of Examples.

After forming an AlN film, the stresses of the AlN film were measured without performing any treatment.
B. Test Results The test results of the respective Examples, the Reference Example and the Comparative Example are shown in FIG. 23. The vertical axis in FIG. 23 indicates the magnitude of the stresses generated in the AlN film. If the magnitude of the stresses is a positive value, it is meant that the AlN film is a tensile stress film. Referring to FIG. 23, it can be appreciated that all the AlN films of the respective Examples, the Reference Example and the Comparative Example are tensile stress films.

As can be noted from the test results of Examples 1-1 and 1-2 in which the ultraviolet irradiation was carried out, the tensile stresses show an increase of about 200 MPa as compared with the case where only the film formation was performed. This is substantially equal to the increase of the tensile stresses in the Comparative Example. It can be seen that the tensile stress increasing effect obtained by the ultraviolet irradiation performed for 600 seconds while maintaining the heating temperature of the wafer W at 400 degrees C. or less is substantially the same as the tensile stress increasing effect obtained by the heat treatment performed for two hours at 500 degrees C. As stated above, in the present tests, the ultraviolet irradiation is performed with respect to the AlN film formed in advance. For that reason, it is highly likely that the ultraviolet irradiation affects only the surface layer of the AlN film. Accordingly, if the ultraviolet irradiation unit 6 is installed in the film formation apparatus and if the ultraviolet irradiation is performed with respect to the molecular layers deposited one above another, it becomes possible to further increase the tensile stresses generated in the AlN film.

On the other hand, in Examples 2-1 and 2-2 in which treatment was performed by the capacitively-coupled plasma apparatus, the tensile stresses are decreased by about 300 to 900 MPa as compared with the case where only the film formation was performed (Reference Example). Accordingly, it can be noted that the plasma treatment performed with respect to the MN film using the plasma generated by a mixture gas of an Ar gas, a hydrogen gas and an $NH_3$ gas or a mixture gas of an Ar gas and an $N_2$ gas acts to decrease the tensile stresses generated in the AlN film after formation of the AlN film. In Examples 2-1 and 2-2, it is highly likely that the plasma treatment affects only the surface layer of the AlN film. Accordingly, if the plasma generation unit 8 is installed in the film formation apparatus and if the plasma treatment is performed with respect to the molecular layers deposited one above another, it becomes possible to form an AlN film of compressive stress film type.

With the present disclosure, when a thin film is obtained by depositing molecular layers of aluminum nitride or a silicon nitride on a substrate placed on a turntable through the use of an ALD method, ultraviolet rays are irradiated on the molecular layers. This makes it possible to control stresses generated in the thin film.

While certain embodiments have been described, these embodiments have been presented by way of example only, and are not intended to limit the scope of the disclosures. Indeed, the novel method, apparatus and storage medium described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film formation method for obtaining a thin film by performing, a plurality of times, a cycle in which different process gases are supplied one after another while revolving a substrate placed on a turntable within a vacuum chamber and depositing a molecular layer of a reaction product composed of aluminum nitride or silicon nitride, comprising:

supplying a first process gas as a source gas for obtaining the reaction product to the substrate while rotating the turntable and revolving the substrate;

supplying a second process gas as a gas for nitriding the first process gas adsorbed to the substrate to the substrate in a position spaced apart along a circumferential direction of the turntable from a position where the first process gas is supplied to the substrate;

providing a separation region along the circumferential direction of the turntable between a first process gas supply position from which the first process gas supplied and a second process gas supply position from which the second process gas supplied as to prevent mixing of the first process gas and the second process gas; and irradiating ultraviolet rays on the molecular layer of the reaction product formed on the substrate placed on the turntable to control stresses generated in the thin film.

2. The film formation method of claim 1, wherein the cycle including supplying the first process gas to the substrate, supplying the second process gas to the substrate, and irradiating the ultraviolet rays is performed during one rotation of the turntable.

3. The film formation method of claim 1, wherein the thin film is a stress liner film for applying stresses to the substrate.

4. The film formation method of claim 3, wherein the substrate includes a protrusion portion having a wall surface, and the thin film is formed along the wall surface of the protrusion portion.

5. The film formation method of claim 1, wherein a pattern-forming process target film and a linear mask pattern are deposited on the substrate one above another in the named order, the thin film is formed to obtain a deposition portion making contact with opposite sidewalls of a mask portion of the linear mask pattern, and the deposition portion is used to, after removing the mask portion, pattern the process target film using the deposition portion as the next mask portion, and wherein irradiating the ultraviolet rays includes controlling an irradiation amount of the ultraviolet rays such that an amount of the ultraviolet rays irradiated on the molecular layer of the reaction product becomes larger at an upper side of the molecular layer than at a lower side of the molecular layer so as to restrain the deposition portion from being collapsed.

6. The film formation method of claim 1, wherein irradiating the ultraviolet rays is intermittently performed such that the ultraviolet rays are not irradiated on n molecular layers among m molecular layers of the reaction product deposited on the substrate, and wherein m and n are natural numbers having a relationship of m>n.

7. A film formation apparatus for obtaining a thin film by performing, a plurality of times, a cycle in which different process gases are supplied one after another while revolving a substrate placed on a turntable within a vacuum chamber and depositing a molecular layer of a reaction product composed of aluminum nitride or a silicon nitride, comprising:

a first process gas supply unit configured to supply a first process gas, as a source gas for obtaining the reaction product, to the substrate;

a second process gas supply unit installed in a position spaced apart from the first process gas supply unit along a circumferential direction of the turntable and configured to supply a second process gas, as a gas for nitriding the first process gas adsorbed to the substrate, to the substrate;

a separation region installed between the first process gas supply unit and the second process gas supply unit along the circumferential direction of the turntable and configured to prevent the first process gas and the second process gas from being mixed with each other; and an ultraviolet irradiation unit configured to irradiate ultraviolet rays on the molecular layer of the reaction product formed on the substrate placed on the turntable to control stresses generated in the thin film.

8. The film formation apparatus of claim 7, further comprising:

a control unit configured to output a control signal such that the cycle including a step of allowing the first process gas to be adsorbed to the substrate, a step of forming the molecular layer of the reaction product by allowing the adsorbed gas to be nitrided by the second process gas and a step of irradiating the ultraviolet rays on the molecular layer is performed a plurality of times.

9. A non-transitory storage medium storing a program used in a film formation apparatus for obtaining a thin film by performing, a plurality of times, a cycle in which different process gases are supplied one after another while revolving a substrate placed on a turntable within a vacuum chamber, the program incorporating steps for performing the film formation method of claim 1.

* * * * *